(12) United States Patent
Um

(10) Patent No.: US 10,235,046 B2
(45) Date of Patent: Mar. 19, 2019

(54) MEMORY SYSTEM AND OPERATING METHOD THEREOF

(71) Applicant: SK hynix Inc., Gyeonggi-do (KR)

(72) Inventor: Gi-Pyo Um, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/609,506

(22) Filed: May 31, 2017

(65) Prior Publication Data

US 2018/0121096 A1    May 3, 2018

(30) Foreign Application Priority Data

Oct. 27, 2016  (KR) .................... 10-2016-0140823

(51) Int. Cl.
| | | |
|---|---|---|
| G06F 3/06 | (2006.01) | |
| G11C 16/00 | (2006.01) | |
| G11C 16/10 | (2006.01) | |
| G11C 5/04 | (2006.01) | |
| G11C 16/04 | (2006.01) | |

(52) U.S. Cl.
CPC .......... *G06F 3/0604* (2013.01); *G06F 3/0659* (2013.01); *G06F 3/0679* (2013.01); *G06F 3/0685* (2013.01); *G11C 5/04* (2013.01); *G11C 16/00* (2013.01); *G11C 16/10* (2013.01); *G11C 16/0483* (2013.01)

(58) Field of Classification Search
CPC .... G06F 3/0659; G06F 3/0604; G06F 3/0685; G06F 3/0679
USPC ......................................... 711/154
See application file for complete search history.

(56) References Cited

U.S. PATENT DOCUMENTS

| | | | |
|---|---|---|---|
| 2014/0185376 A1* | 7/2014 | Sinclair .................. | G11C 16/10 365/185.03 |
| 2015/0052395 A1* | 2/2015 | Wipfel ................ | G06F 11/1451 714/19 |

FOREIGN PATENT DOCUMENTS

KR         101014405       2/2011

* cited by examiner

*Primary Examiner* — Hua J Song
(74) *Attorney, Agent, or Firm* — IP & T Group LLP

(57) ABSTRACT

A memory system may include: a memory device including a plurality of memory dies; and a controller suitable for generating instruction information instructing sequential completion of program operations for the plurality of memory dies in response to a write command and transmitting the write command and the instruction information to the memory device.

11 Claims, 18 Drawing Sheets

FIG. 6B

| | Flash 0 (610) | Flash 1 (630) | Flash 2 (650) | Flash 3 (670) | |
|---|---|---|---|---|---|
| | Block#0 | Block#0 | Block#0 | Block#0 | Super Block#0 |
| | Block#1 | Block#1 | Block#1 | Block#1 | Super Block#1 |
| | Block#2 | Block#2 | Block#2 | Block#2 | Super Block#2 |
| | Block#3 | Block#3 | Block#3 | Block#3 | |
| | Block#4 | Block#4 | Block#4 | Block#4 | |
| | Block#5 | Block#5 | Block#5 | Block#5 | |
| | Block#6 | Block#6 | Block#6 | Block#6 | |
| | Block#7 | Block#7 | Block#7 | Block#7 | |

MEMORY SYSTEM AND OPERATING METHOD THEREOF

CROSS-REFERENCE TO RELATED APPLICATIONS

The present application claims priority of Korean Patent Application No. 10-2016-0140823, filed on Oct. 27, 2016, which is incorporated herein by reference in its entirety.

BACKGROUND

1. Field

Exemplary embodiments of the present invention relate to a memory system and an operating method thereof.

2. Description of the Related Art

Recently, the paradigm of the computer environment is changed into a ubiquitous computing environment which allows users to get an access to a computer system anywhere anytime. For this reason, the use of portable electronic devices, such as mobile phones, digital cameras, laptop computers and the like, is surging. The portable electronic devices generally employ a memory system using a memory device for storing data. A memory system may be used as a main memory device or an auxiliary memory device of a portable electronic device.

A memory device has excellent stability and durability because it does not include a mechanical driving unit. Also, the memory device is advantageous in that it may access data quickly and consume a small amount of power. Non-limiting examples of a memory device having these advantages include a Universal Serial Bus (USB) memory device, a memory card with diverse interfaces, and a Solid-State Drive (SSD).

SUMMARY

Various embodiments are directed to a memory system employing a memory device, the memory system being advantageous in reducing the complexity of the memory system, maximizing the utilization efficiency of the memory device, reducing performance deterioration over time and more rapidly and stably processing data to the memory device. Various embodiments are also directed to an operating method of the memory system.

In an embodiment, a memory system may include: a memory device including a plurality of memory dies; and a controller suitable for generating instruction information instructing sequential completion of program operations for the plurality of memory dies in response to a write command and transmitting the write command and the instruction information to the memory device.

In an embodiment, a memory device may include first and second memory dies each having a plurality of memory blocks. The first and second memory dies may perform program operations in response to received write commands, and complete the program operations in response to instruction information Instructing sequential completion of program operations for the first and second memory dies.

In an embodiment, there is provided an operating method of a memory system including a memory device having a plurality of memory dies. The operating method may include: generating instruction information in response to a write command, the instruction information instructing sequential completion of program operations for the plurality of memory dies; and transmitting the write command and the instruction information to the memory device.

BRIEF DESCRIPTION OF THE DRAWINGS

The above and other features and advantages of the present invention will become more apparent to those skilled in the art to which the present invention pertains by the following detailed description with reference to the attached drawings in which:

FIGS. 6A and 6B are diagrams illustrating examples of a memory device in accordance with an embodiment of the present invention.

DETAILED DESCRIPTION

Figure 1:
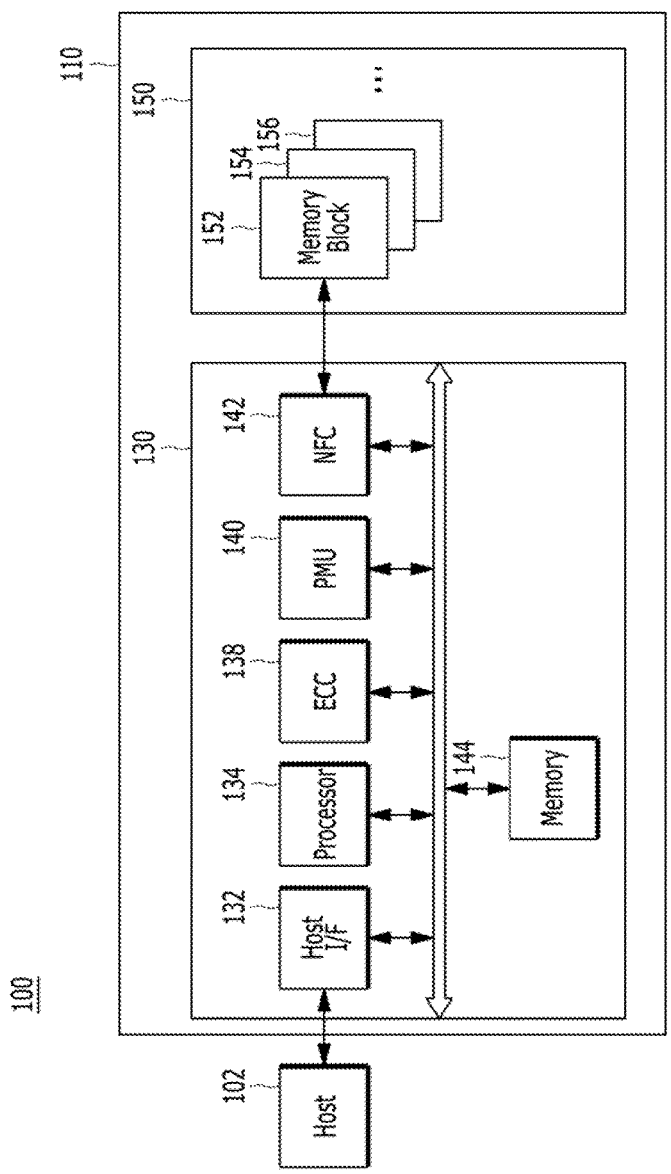
FIG. 1 is a block diagram illustrating a data processing system including a memory system in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to more clearly illustrate the various elements of the embodiments. For example, in the drawings, the size of elements and the intervals between elements may be exaggerated compared to actual sizes and intervals for convenience of illustration.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The phrase "at least one of . . . and . . . ," when used herein with a list of items, means a single item from the list or any combination of items in the list. For example, "at least one of A, B, and C" means, only A, or only B, or only C, or any combination of A, b, and C.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, the various embodiments of the present invention will be described in detail with reference to the attached drawings.

FIG. 1 is a block diagram illustrating a data processing system 100 including a memory system 110 in accordance with an embodiment of the present invention.

Referring to FIG. 1, the data processing system 100 may include a host 102 operatively coupled to the memory system 110.

The host 102 may be any suitable electronic device including portable electronic devices such as a mobile phone, MP3 player and laptop computer or non-portable electronic devices such as a desktop computer, game machine, TV and projector. The host 102 may include at least one OS (operating system), and the OS may manage and control the overall functions and operations of the host 102, and also provide an operation between the host 102 and a user using the data processing system 100 or the memory system 110. The OS may support functions and operations corresponding to the use purpose and usage of a user. For example, the OS may be divided into a general OS and a mobile OS, depending on the mobility of the host 102. The general OS may be divided into a personal OS and an enterprise OS, depending on the environment of a user. For example, the personal OS configured to support a function of providing a service to general users may include Windows and Chrome, and the enterprise OS configured to secure and support high performance may include Windows server, Linux and Unix. Furthermore, the mobile OS configured to support a function of providing a mobile service to users and a power saving function of a system may include Android, iOS and Windows Mobile. The host 102 may include one or more of Oss. The host 102 may execute an OS to perform an operation corresponding to a user's request on the memory system 110.

The memory system 110 may operate to store data for the host 102 in response to a request of the host 102. Non-limited examples of the memory system 110 may include a solid state drive (SSD), a multi-media card (MMC), a secure digital (SD) card, universal storage bus (USB) device, a universal flash storage (UFS) device, compact flash (CF) card, a smart media card (SMC), a personal computer memory card international association (PCMCIA) card and memory stick. The MMC may include an embedded MMC (eMMC), reduced size MMC (RS-MMC) and micro-MMC. The SD card may include a mini-SD card and micro-SD card.

The memory system 110 may be embodied by various types of storage devices. Non-limited examples of storage devices included in the memory system 110 may include volatile memory devices such as a dynamic random access memory (DRAM) and a static RAM (SRAM) and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), resistive RAM (RRAM) and a flash memory. The flash memory may have a 3-dimensional (3D) stack structure.

The memory system 110 may include a memory device 150 and a controller 130. The memory device 150 may store data for the host 120, and the controller 130 may control data storage into the memory device 150.

The controller 130 and the memory device 150 may be integrated into a single semiconductor device, which may be included in the various types of memory systems as exemplified above.

Non-limited application examples of the memory system 110 may include a computer, an Ultra Mobile PC (UMPC), a workstation, a net-book, a Personal Digital Assistant (PDA), a portable computer, a web tablet, a tablet computer, a wireless phone, a mobile phone, a smart phone, an e-book, a Portable Multimedia Player (PMP), a portable game machine, a navigation system, a black box, a digital camera, a Digital Multimedia Broadcasting (DMB) player, a 3-dimensional television, a smart television, a digital audio recorder, a digital audio player, a digital picture recorder, a digital picture player, a digital video recorder, a digital video player, a storage device constituting a data center, a device capable of transmitting/receiving information in a wireless environment, one of various electronic devices constituting a home network, one of various electronic devices constituting a computer network, one of various electronic devices constituting a telematics network, a Radio Frequency Identification (RFID) device, or one of various components constituting a computing system.

The memory device 150 may be a nonvolatile memory device and may retain data stored therein even though power is not supplied. The memory device 150 may store data provided from the host 102 through a write operation, and provide data stored therein to the host 102 through a read operation. The memory device 150 may include a plurality of memory dies (not shown), each memory die including a plurality of planes (not shown), each plane including a plurality of memory blocks 152 to 156, each of the memory blocks 152 to 156 may include a plurality of pages, and each of the pages may include a plurality of memory cells coupled to a word line.

The controller 130 may control the memory device 150 in response to a request from the host 102. For example, the controller 130 may provide data read from the memory device 150 to the host 102, and store data provided from the host 102 into the memory device 150. For this operation, the controller 130 may control read, write, program and erase operations of the memory device 150.

The controller 130 may include a host interface (I/F) unit 132, a processor 134, an error correction code (ECC) unit 138, a Power Management Unit (PMU) 140, a NAND flash controller (NFC) 142 and a memory 144 all operatively coupled via an internal bus.

The host interface unit 132 may be configured to process a command and data of the host 102, and may communicate with the host 102 through one or more of various interface protocols such as universal serial bus (USB), multi-media card (MMC), peripheral component interconnect-express (PCI-E), small computer system interface (SCSI), serial-attached SCSI (SAS), serial advanced technology attachment (SATA), parallel advanced technology attachment (PATA), enhanced small disk interface (ESDI) and integrated drive electronics (IDE).

The ECC unit 138 may detect and correct an error contained in the data read from the memory device 150. In other words, the ECC unit 138 may perform an error correction decoding process to the data read from the memory device 150 through an ECC code used during an ECC encoding process. According to a result of the error correction decoding process, the ECC unit 138 may output a signal, for example, an error correction success/fail signal. When the number of error bits is more than a threshold value of correctable error bits, the ECC unit 138 may not correct the error bits, and may output an error correction fail signal.

The ECC unit 138 may perform error correction through a coded modulation such as Low Density Parity Check (LDPC) code, Bose-Chaudhri-Hocquenghem (BCH) code, turbo code, Reed-Solomon code, convolution code, Recursive Systematic Code (RSC), Trellis-Coded Modulation (TCM) and Block coded modulation (BCM). However, the ECC unit 138 is not limited thereto. The ECC unit 138 may include all circuits, modules, systems or devices for error correction.

The PMU 140 may provide and manage power of the controller 130.

The NFC 142 is an example of a memory/storage interface for interfacing the controller 130 and the memory device 150 when the memory device is a NAND flash memory, such that the controller 130 controls the memory device 150 in response to a request from the host 102. When the memory device 150 is a flash memory or specifically a NAND flash memory, the NFC 142 may generate a control signal for the memory device 150 and process data to be provided to the memory device 150 under the control of the processor 134. The NFC 142 may work as an interface (e.g., a NAND flash interface) for processing a command and data between the controller 130 and the memory device 150. Specifically, the NFC 142 may support data transfer between the controller 130 and the memory device 150. Other memory/storage interfaces may be used when a different type memory device is employed.

The memory 144 may serve as a working memory of the memory system 110 and the controller 130, and store data for driving the memory system 110 and the controller 130. The controller 130 may control the memory device 150 to perform read, write, program and erase operations in response to a request from the host 102. The controller 130 may provide data read from the memory device 150 to the host 102, may store data provided from the host 102 into the memory device 150. The memory 144 may store data required for the controller 130 and the memory device 150 to perform these operations.

The memory 144 may be embodied by a volatile memory. For example, the memory 144 may be embodied by static random access memory (SRAM) or dynamic random access memory (DRAM). The memory 144 may be disposed within or out of the controller 130. FIG. 1 exemplifies the memory 144 disposed within the controller 130. In an embodiment, the memory 144 may be embodied by an external volatile memory having a memory interface transferring data between the memory 144 and the controller 130.

The processor 134 may control the overall operations of the memory system 110. The processor 134 may drive firmware to control the overall operations of the memory system 110. The firmware may be referred to as flash translation layer (FTL).

The processor 134 of the controller 130 may include a management unit (not illustrated) for performing a bad management operation of the memory device 150. The management unit may perform a bad block management operation of checking a bad block, in which a program fail occurs due to the characteristic of a NAND flash memory during a program operation, among the plurality of memory blocks 152 to 156 included in the memory device 150. The management unit may write the program-failed data of the bad block to a new memory block. In the memory device 150 having a 3D stack structure, the bad block management operation may reduce the use efficiency of the memory device 150 and the reliability of the memory system 110. Thus, the bad block management operation needs to be performed with more reliability.

Figure 2:
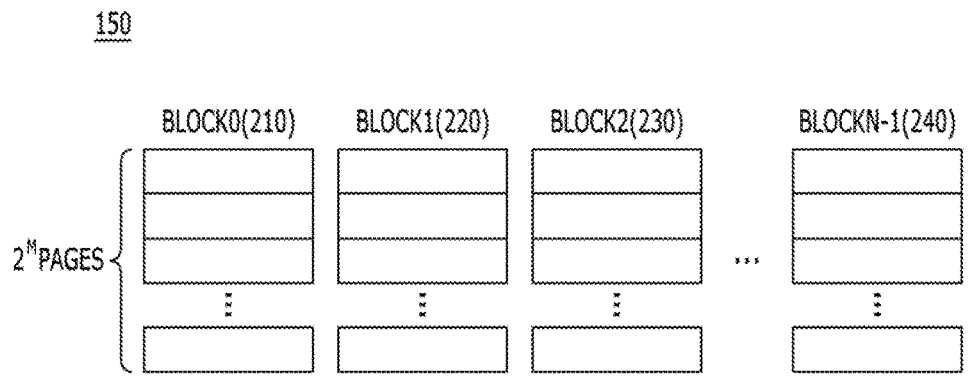
FIG. 2 is a schematic diagram illustrating an exemplary configuration of a memory device employed in the memory system of FIG. 1.

FIG. 2 is a schematic diagram illustrating the memory device 150.

Referring to FIG. 2, the memory device 150 may include a plurality of memory blocks 0 to N−1, and each of the blocks 0 to N−1 may include a plurality of pages, for example, $2^M$ pages, the number of which may vary according to circuit design. Memory cells included in the respective memory blocks 0 to N−1 may be one or more of a single level cell (SLC) storing 1-bit data, a multi-level cell (MLC) storing 2-bit data, an MLC storing 3-bit data also referred to as a triple level cell (TLC), an MLC storing 4-bit data also referred to as a quadruple level cell (QLC), or an MLC storing 5-bit or more bit data.

Figure 3:
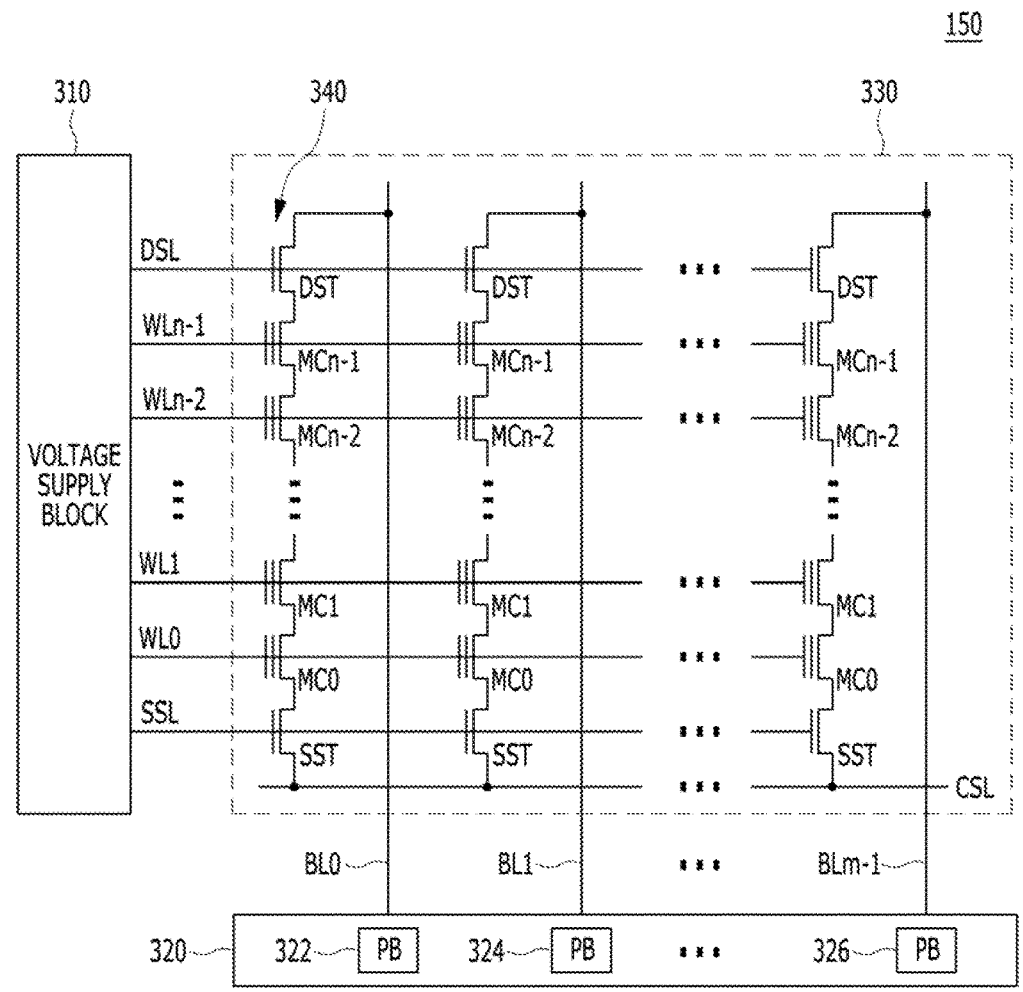
FIG. 3 is a circuit diagram illustrating an exemplary configuration of a memory cell array of a memory block in the memory device of FIG. 2.

FIG. 3 is a circuit diagram illustrating an exemplary configuration of a memory cell array of a memory block in the memory device 150.

Referring to FIG. 3, a memory block 330 which may correspond to any of the plurality of memory blocks 152 to 156 included in the memory device 150 of the memory system 110 may include a plurality of cell strings 340 coupled to a plurality of corresponding bit lines BL0 to BLm−1. The cell string 340 of each column may include one or more drain select transistors DST and one or more source select transistors SST. Between the drain and select transistors DST and SST, a plurality of memory cells MC0 to MCn−1 may be coupled in series. In an embodiment, each of the memory cell transistors MC0 to MCn−1 may be embodied by an MLC capable of storing data information of a plurality of bits. Each of the cell strings 340 may be electrically coupled to a corresponding bit line among the plurality of bit lines BL0 to BLm−1. For example, as illustrated in FIG. 3, the first cell string is coupled to the first bit line BL0, and the last cell string is coupled to the last bit line BLm−1.

Although FIG. 3 illustrates NAND flash memory cells, the invention is not limited in this way. For example, it is noted that the memory cells may be NOR flash memory cells, or hybrid flash memory cells including two or more kinds of memory cells combined therein. Also, it is noted that the memory device 150 may be a flash memory device including a conductive floating gate as a charge storage layer or a charge trap flash (CTF) memory device including an insulation layer as a charge storage layer.

The memory device 150 may further include a voltage supply unit 310 which provides word line voltages including a program voltage, a read voltage and a pass voltage to supply to the word lines according to an operation mode. The voltage generation operation of the voltage supply unit 310 may be controlled by a control circuit (not illustrated). Under the control of the control circuit, the voltage supply unit 310 may select one of the memory blocks (or sectors) of the memory cell array, select one of the word lines of the selected memory block, and provide the word line voltages to the selected word line and the unselected word lines as may be needed.

The memory device 150 may include a read/write circuit 320 which is controlled by the control circuit. During a verification/normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs), and each of the page buffers 322 to 326 may include a plurality of latches (not illustrated).

Figure 4:
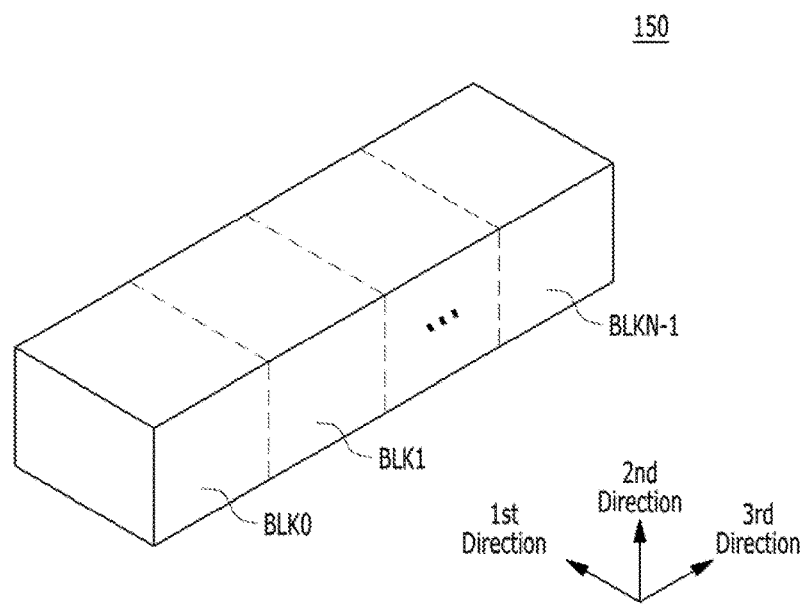
FIG. 4 is a schematic diagram illustrating an exemplary three-dimensional structure of the memory device of FIG. 2.

FIG. 4 is a schematic diagram illustrating an exemplary 3D structure of the memory device 150.

The memory device 150 may be embodied by a 2D or 3D memory device. Specifically, as illustrated in FIG. 4, the memory device 150 may be embodied by a nonvolatile memory device having a 3D stack structure. When the memory device 150 has a 3D structure, the memory device 150 may include a plurality of memory blocks BLK0 to BLKN−1 each having a 3D structure (or vertical structure).

Hereinbelow, detailed description will be made with reference to FIGS. 5 to 12B, for data processing with respect to a memory device in a memory system in accordance with an embodiment, particularly, operations of performing a command operation corresponding to a command received from a host 102 and determining whether the command operation is performed.

Figure 5:
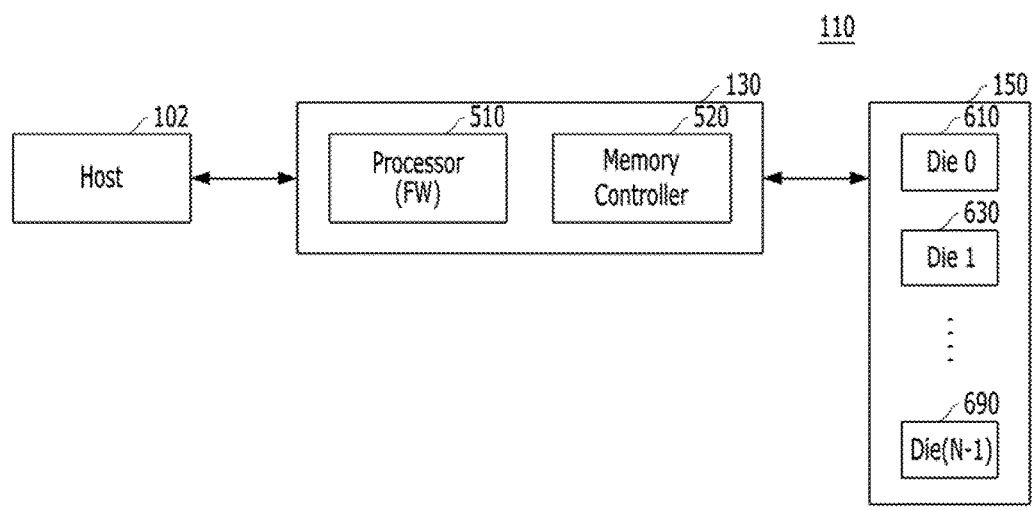
FIG. 5 is a diagram illustrating a memory system in accordance with an embodiment of the present invention.

FIG. 5 is a diagram illustrating a memory system 110 in accordance with an embodiment of the present invention.

Referring to FIG. 5, the memory system 110 may include a controller 130 and a memory device 150. The controller 130 may include a processor 510 and a memory controller 520. The processor 510 and the memory controller 520 may correspond to the processor 134 and the NFC 142, respectively, which are illustrated in FIG. 1. The processor 510 may drive firmware (FW) referred to as flash translation layer (FTL) in order to control overall operations of the memory system 110.

The memory device 150 may include a plurality of memory dies. For example, the memory device 150 may include N memory dies including a first memory die Die0 610, a second memory die Die1 630, . . . , and an (N−1)th memory die Die(N−1) 690. Each of the N memory dies may include a plurality of planes, and each of the planes may include a plurality of memory blocks. In various embodiments, the memory device 150 may be implemented with a NAND flash memory.

Figure 6A:
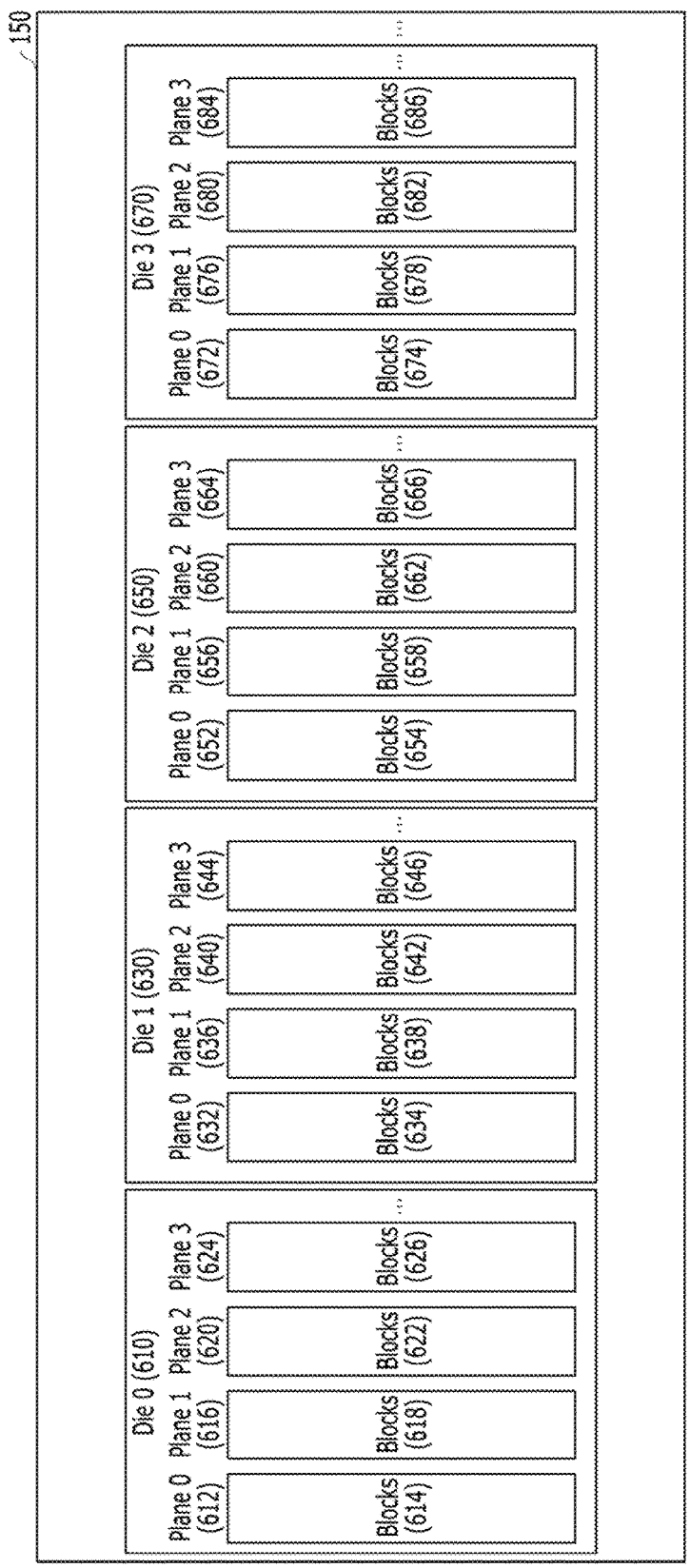

FIGS. 6A and 6B are diagrams illustrating examples of the memory device 150 of FIG. 5 in accordance with an embodiment of the present invention.

Referring to FIG. 6A, the memory device 150 may include a plurality of memory dies. For example, the memory device 150 may include a memory die 0(610), a memory die 1(630), a memory die 2(650) and a memory die 3(670). Each of the memory dies 610, 630, 650 and 670 may include a plurality of planes. For example, the memory die 0(610) may include a plane 0(612), a plane 1(616), a plane 2(620) and a plane 3(624). The memory die 1(630) may include a plane 0(632), a plane 1(636), a plane 2(640) and a plane 3(644). The memory die 2(650) may include a plane 0(652), a plane 1(656), a plane 2(660) and a plane 3(664). The memory die 3(670) may include a plane 0(672), a plane 1(676), a plane 2(680) and a plane 3(684). Each of the planes 612, 616, 620, 624, 632, 636, 640, 644, 652, 656, 660, 664, 672, 676, 680 and 684 of the memory dies 610, 630, 650 and 670 included in the memory device 150 may include a plurality of memory blocks 614, 618, 622, 626, 634, 638, 642, 646, 654, 658, 662, 666, 674, 678, 682 and 686, respectively. For example, as described above with reference to FIG. 2, each of the planes may include N blocks Block0, Block1, . . . , BlockN−1 each including a plurality of pages, for example, $2^M$ pages.

Referring to FIG. 6B, the memory device 150 may include a plurality of memory dies 610, 630, 650 and 670. Each of the memory dies may be implemented with a NAND flash memory or NAND chip. Since the capacity of the memory device 150, required in the market, is continuously increasing, the memory device 150 may be configured to include a plurality of NAND chips instead of one NAND chip, in order to satisfy the required capacity.

Referring back to FIG. 5, the controller 130 for controlling overall operations of the memory system 110 needs to control the NAND chips on a basis of a plurality of memory blocks. For example, the FTL of the controller 130 may require a logical block which is referred to as 'super block'.

Referring back to FIG. 6B, the memory device 150 may include the plurality of NAND flash chips 610, 630, 650 and 670. Each of the chips may include a plurality of blocks Block#0 to Block#7. The memory blocks Block#0 of the respective chips may constitute a super block Super Block#0, the memory blocks Block#1 of the respective chips may constitute a super block Super Block#1, and the memory blocks Block#2 of the respective chips may constitute a super block Super Block#2. Since the NAND chips can independently operate, the chips can immediately process requests received from the controller 130. The times required to process the requests may differ from chip to chip. That is, although the requests are transmitted to the chips from the controller 130 at the same time point, the processing times of the respective chips may not be sequential.

Figure 7A:
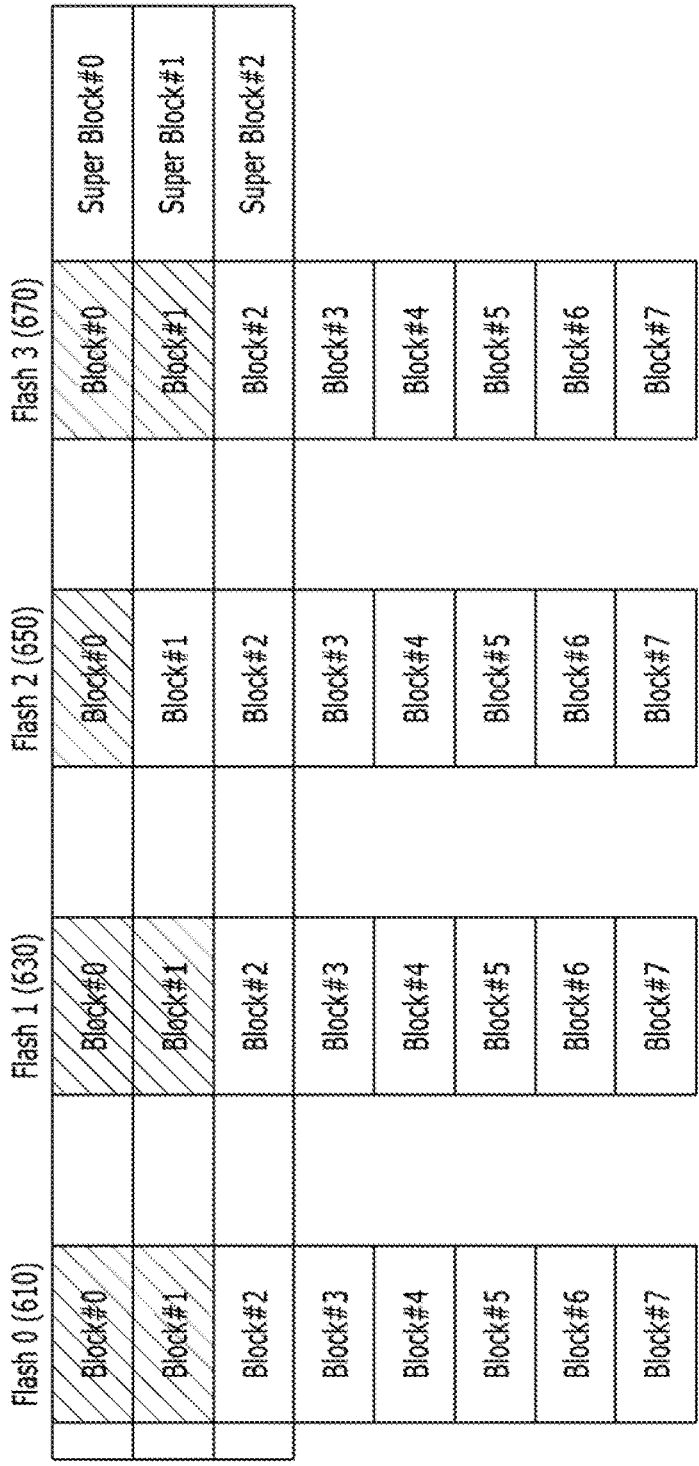
FIGS. 7A and 7B are diagrams illustrating examples of a program operation by the memory system in accordance with the present embodiment of the present invention.

Referring to FIG. 7A, program operations may not be sequentially performed in the super blocks of the memory device 150. For example, when the controller 130 transmits continuous data such as an audio file having a certain size to the memory device 150, the data transmitted to the memory device 150 may not be sequentially programmed in the super blocks. The controller 130 may expect that data will be sequentially programmed in the super blocks Super Block#0 and Super Block#1. Against such an expectation, the data may be non-sequentially programmed into the super block Super Block#1 in the order of Flash0 (610), Flash1 (630), and Flash3 (670), even though the data are sequentially programmed into the super block Super Block#0 in the order of Flash0 (610), Flash1 (630), Flash2 (650) and Flash3 (670).

Figure 7B:
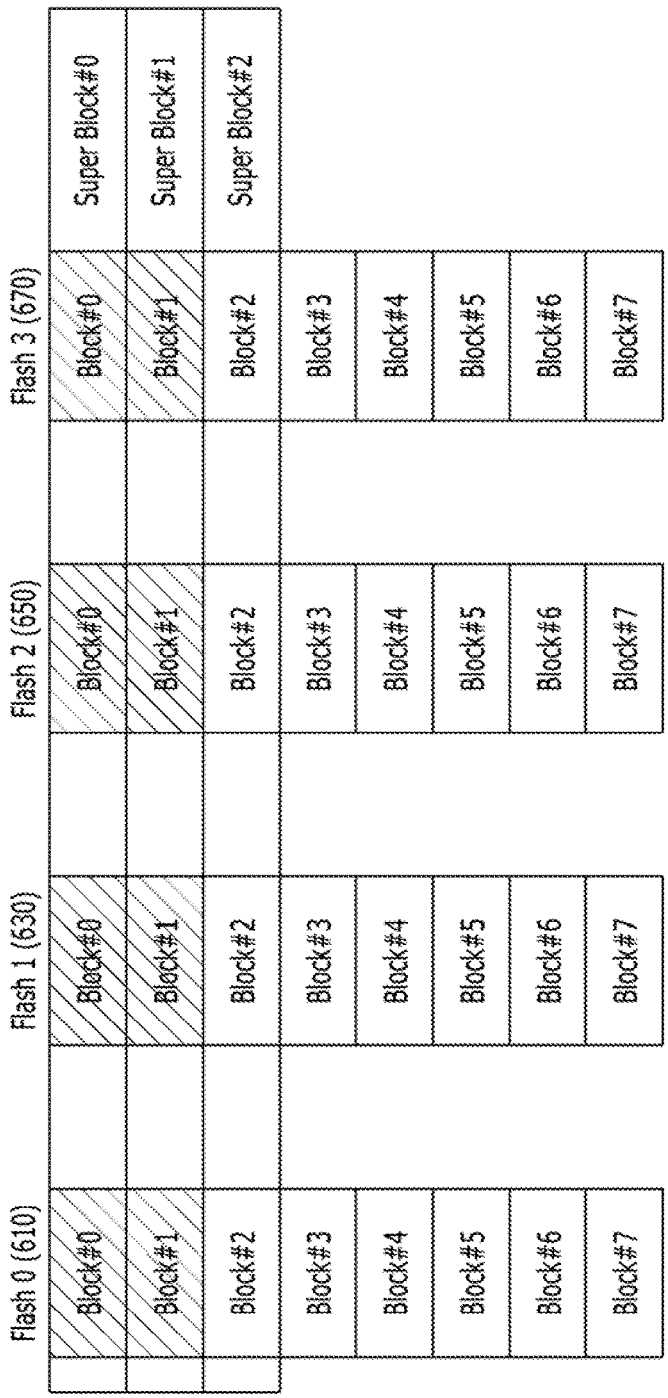

Referring to FIG. 7B, the program operations in the super block Super Block#1 may be completed in the order of Flash0 (610), Flash1 (630), Flash3 (670) and Flash2 (650). Thus, the program sequence may be changed. In such a state, if a power-off occurs, a discontinuity of the data may occur that could break the validity of the data. This state may correspond to an exceptional structure different from the structure expected by the controller 130. Such an exceptional structure may complicate the controller 130, and cause an imperfect result.

Suppose that program operations were non-sequentially performed in the super block Super Block#1 in the order of Flash0 (610), Flash1 (630), Flash3 (670) and Flash2 (650) as illustrated in FIGS. 7A and 7B, while data were expected to be written to logical block addresses LBA0 to LBA3, that is, the program operations were expected to be performed in order of Flash0 (610), Flash1 (630), Flash2 (650) and Flash3 (670). In this case, when read operations are performed on the logical block addresses LBA0 to LBA3 after the program operations were performed as illustrated in FIG. 7A, the data of the logical block addresses LBA0, LBA1 and LBA3 may correspond to new data, while the data of the logical block address LBA2 may correspond to old data. That is, the validity of the data may be broken.

The memory system in accordance with an embodiment of the present invention can guarantee a processing order when a memory device including a plurality of memory dies (or NAND flash chips) requires sequential programming, thereby preventing a loss in validity of data. That is, an embodiment of the present invention can provide a sequential programming method which guarantees the continuity of data in a memory device including a plurality of memory dies such as a plurality of NAND flash chips.

Figure 8:
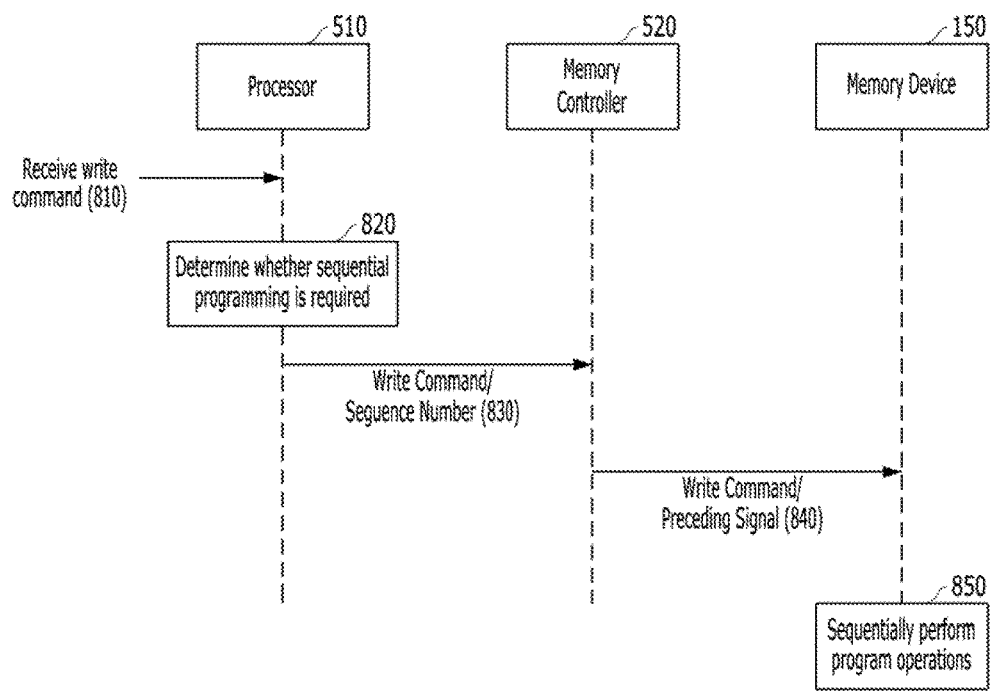
FIG. 8 is a diagram illustrating a program operation procedure by the memory system in accordance with the present embodiment of the present invention.

FIG. 8 is a diagram illustrating a program operation procedure by the memory system in accordance with an embodiment of the present invention. The described procedure is an example of an operation performed among the processor 510, the memory controller 520 and the memory device 150 in FIG. 5. However, we note that the described procedure may also be applied in a similar manner with a single processor or a single controller.

Referring to FIG. 8, the processor 510 may receive a write command at step 810. For example, the write command may be received from the host 102.

In response to the received write command, the processor 510 may determine whether sequential programming is required in the plurality of memory dies included in the memory device 150, at step 820. When a determination is made that sequential programming is required, the processor 510 may transmit a write command and sequence numbers to the memory controller 520 at step 830, the sequence numbers indicating a programming sequence. Each of the sequence numbers may indicate a programming sequence for memory blocks constituting a super block in the plurality of memory dies (for example, 610, 630, 650 and 670 in FIG. 6A).

The memory controller 520 may generate instruction signals (for example, preceding signals) and provide the generated instruction signals to the plurality of memory dies at step 840. In some embodiments, the instruction signals may instruct the memory dies to sequentially complete the programming operations for the memory blocks based on the received sequence numbers.

The memory dies included in the memory device 150 may start program operations in response to the received write command, and complete the program operations when the corresponding instruction signals are received, thereby sequentially performing the program operations, at step 850. In accordance with various embodiments, each of the memory dies may start the program operation in response to the received write command, and perform the program operation up to a preset step. Then, the memory die may transition to a program suspended state, and resume and complete the program operation in response to the corresponding instruction signal. Furthermore, each of the memory dies may transmit a report signal to the controller 130 or the memory controller 520. In some embodiments, the report signal may indicate the completion of the program operation.

Figure 9:
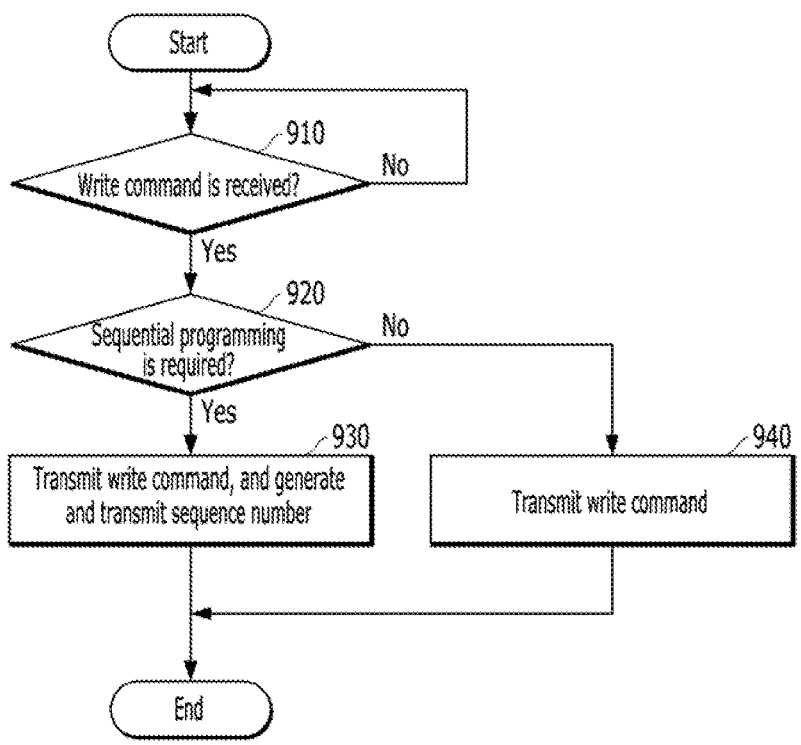
FIG. 9 is a flowchart illustrating a process flow of a program operation by a processor in accordance with the present embodiment of the present invention.

FIG. 9 is a flowchart illustrating a process flow of a program operation by the processor in accordance with an embodiment of the present invention. The process flow may be performed by the processor 510.

Referring to FIG. 9, the processor 510 may determine whether a write command was received, at step 910. When determining that the write command was received (step 910, Yes), the processor 510 may determine whether sequential programming is required in the plurality of memory dies included in the memory device 150, at step 920. When determining that sequential programming (or sequential write) is required, the processor 510 may proceed to step 930. Otherwise, the processor 510 may proceed to step 940.

When determining that sequential programming is not required (step 920, No), the processor 510 may transmit the received write command to the memory controller 520 at step 940.

Figure 12A:
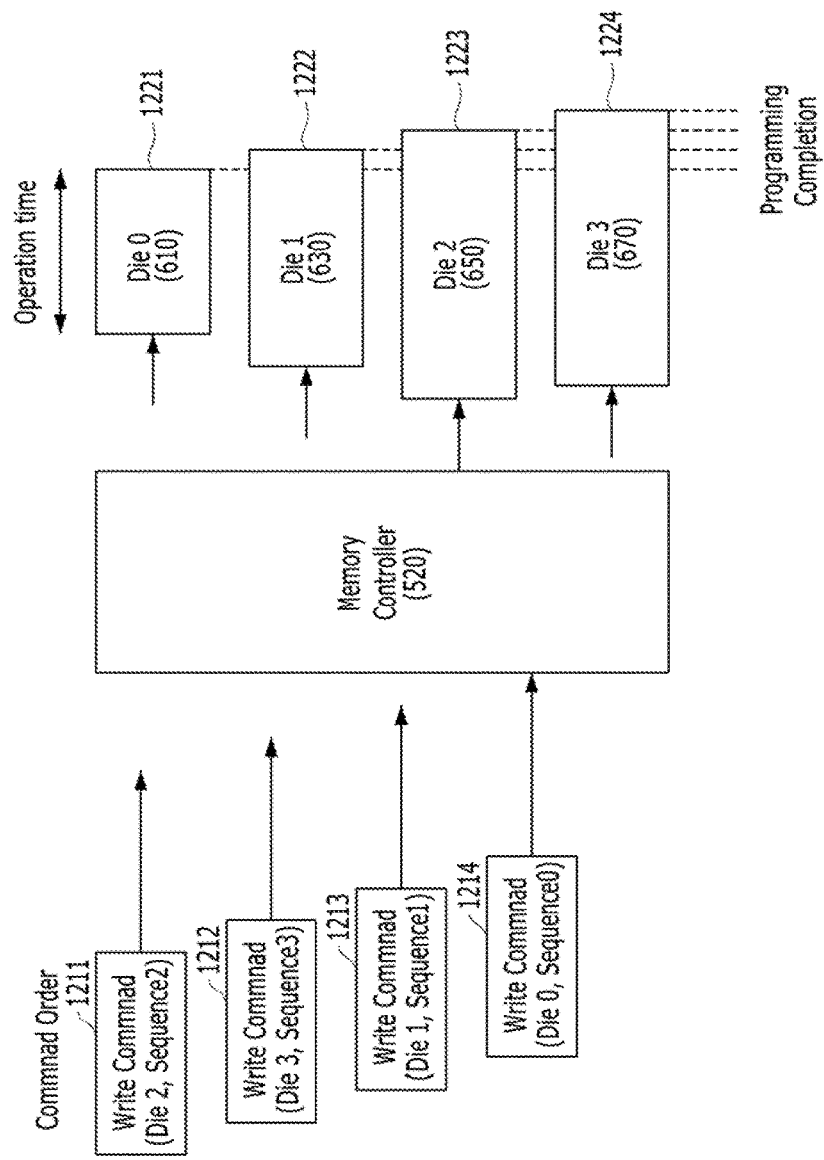
FIGS. 12A and 12B are diagrams illustrating examples of the program operation by the memory system in accordance with an embodiment of the present invention.

When determining that sequential programming is required (step 920, Yes), the processor 510 may generate sequence numbers indicating the programming sequence, and transmit the write command and the sequence numbers to the memory controller 520, at step 930. For example, the processor 510 may transmit the write command and the sequence numbers to the memory controller 520 as illustrated in FIG. 12A described later.

Figure 10:
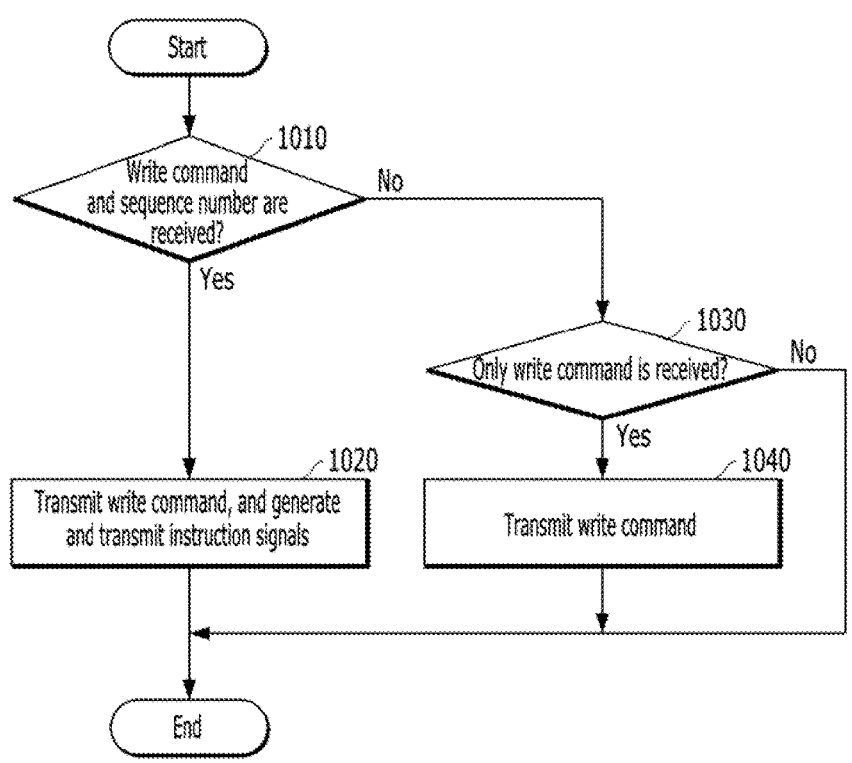
FIG. 10 is a flowchart illustrating a process flow of a program operation by a memory controller in accordance with the present embodiment of the present invention.

FIG. 10 is a flowchart illustrating a process flow of a program operation by the memory controller in accordance with a present embodiment of the present invention. The process flow may be performed by the memory controller 520.

Referring to FIG. 10, the memory controller 520 may determine whether the write command and the sequence numbers were received, at step 1010. When determining that all of the write command and the sequence numbers were received (step 1010, Yes), the memory controller 520 may proceed to step 1020, and when determining that all of the write command and the sequence numbers were not received (step 1010, No), the memory controller 520 may proceed to step 1030.

At step 1030, the memory controller 520 may determine whether only the write command was received. When determining that only the write command was received (step 1030, Yes), the memory controller 520 may transmit the write command to the memory device 150 at step 1040.

Figure 12B:
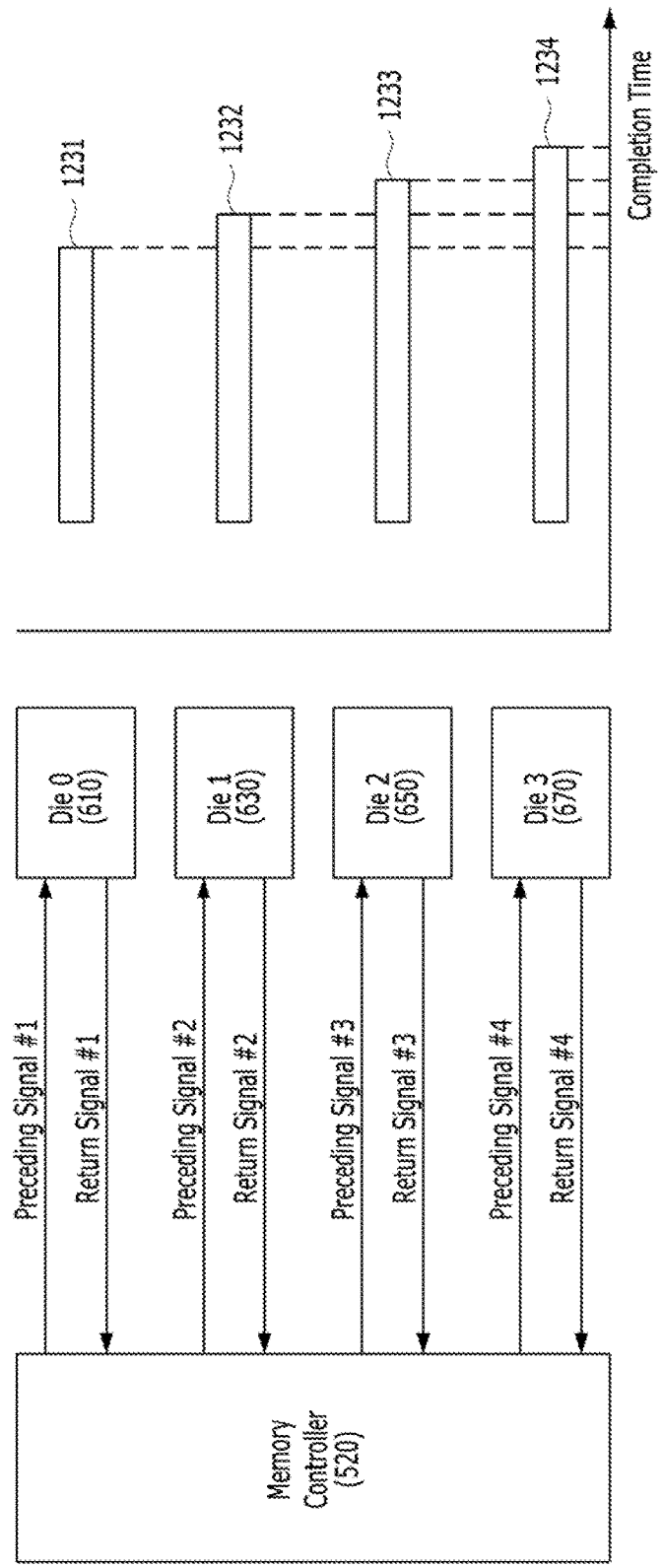

At step 1020, the memory controller 520 may generate instruction signals (for example, preceding signals) based on the received sequence numbers. In some embodiments, the instruction signals may indicate the sequential completion of the program operations for the memory blocks included in the memory device 150. Then, the memory controller 520 may provide the write command and the generated instruction signals to the respective memory dies. In accordance with an embodiment, the generation and transmission of the instruction signals may be performed after the write command is transmitted. As illustrated in FIG. 12B described later, the instruction signals may be generated and transmitted at different points of time.

Figure 11:
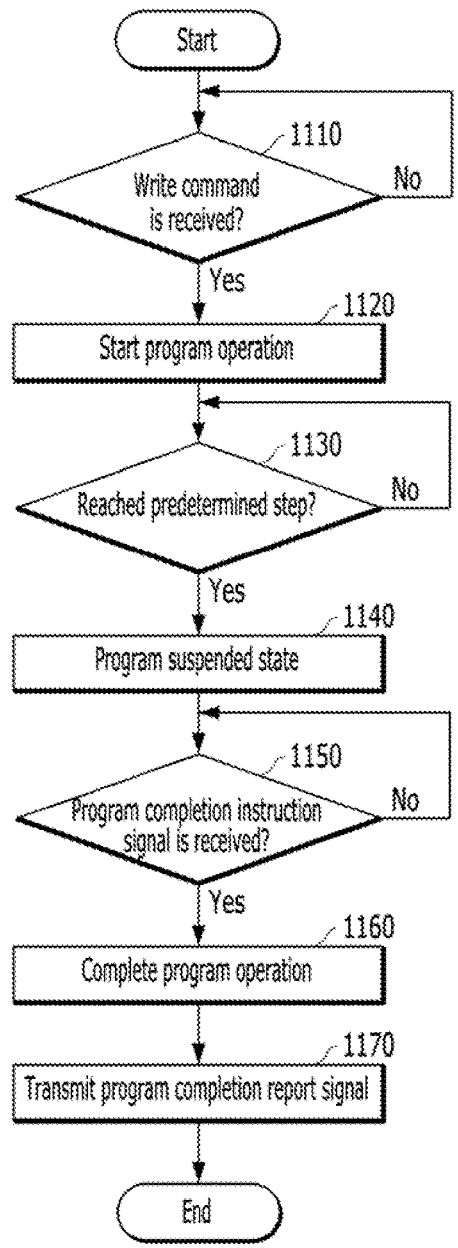
FIG. 11 is a flowchart illustrating a process flow of a program operation by the memory device in accordance with the present embodiment of the present invention.

FIG. 11 is a flowchart illustrating a process flow of a program operation by the memory device in accordance with an embodiment of the present invention. The process flow may be performed by each of the memory dies included in the memory device 150 illustrated in FIG. 8. In FIG. 11, however, it will be described that the process flow is collectively performed by the memory device 150.

Referring to FIG. 11, the memory device 150 may determine whether the write command was received, at step 1110. When determining that the write command was received (step 1110, Yes), the memory device 150 may start a program operation in response to the received write command at step 1120.

At step 1130, the memory device 150 may determine whether the program operation reached a predetermined step after the program operation was started. For example, when the program operation is divided into 10 steps from a first step to a tenth step, the memory device 150 may determine whether the program operation reached the ninth step which may be the predetermined step.

When determining that the program operation reached the predetermined step (step 1130, Yes), the memory device 150 may transition to a program suspended state at step 1140.

At step 1150, the memory device 150 may determine whether an instruction signal, for example, a program completion instruction signal was received. The instruction signal may instruct the memory device 150 to complete the program operation. When determining that the instruction signal instructing the memory device to complete the program operation was received (step 1150, Yes), the memory device 150 may resume the suspended program operation and complete the program operation, in response to the instruction signal, at step 1160. For example, when the program operation is divided into ten steps, the memory device 150 having transitioned to the suspended state after the ninth step of the program operation may perform the tenth step as the last step in response to the instruction signal.

At step 1170, the memory device 150 may transmit a report signal, for example, a program completion report signal to the memory controller 520. The report signal may indicate the completion of the program operation.

FIGS. 12A and 12B are diagrams illustrating examples of the program operation by the memory system in accordance with an embodiment of the present invention.

Referring to FIG. 12A, the processor 510 of FIG. 5 may drive the firmware FW to generate sequence numbers indicating the sequential completion of program operations, contain the generated sequence numbers in write commands, and transmit the write commands to the memory controller 520. For example, when the memory die Die0 610 and the memory die Die1 630 are busy and the memory die Die2 650 and the memory die Die3 670 are idle, the processor 510 may sequentially transmit a write command 1211 for the memory die Die2 650, a write command 1212 for the memory die Die3 670, a write command 1213 for the memory die Die1 630, and a write command 1214 for the memory die Die0 610 to the memory controller 520.

In accordance with the various embodiments, the write commands may contain or include the sequence numbers indicating the sequence of programming operations for the respective memory dies 610, 630, 650 and 670. For example, the write command 1214 for the memory die Die0 610 may contain a sequence number Sequence0, the write command 1213 for the memory die Die1 630 may contain a sequence number Sequence1, the write command 1212 for the memory die Die3 670 may contain a sequence number Sequence3, and the write command 1211 for the memory die Die2 650 may contain a sequence number Sequence2.

In response to the sequence numbers, the program operation 1221 for the memory die Die0 610 may be completed, the program operation 1222 for the memory die Die1 630 may be completed, the program operation 1223 for the memory die Die2 650 may be completed, and the program operation 1224 for the memory die Die3 670 may be finally completed.

Referring to FIG. 12B, the memory controller 520 of FIG. 5 may generate a first instruction signal Preceding Signal #1 and transmit the generated signal to the memory die Die0 610. The memory die Die0 610 may start the program operation in response to the received write command, complete the program operation in response to the received first instruction signal, and transmit a first report signal Return Signal #1 to the memory controller 520. The first report signal Return Signal #1 may indicate the completion of the program operation.

In response to the first report signal Return Signal#1, the memory controller 520 may generate a second instruction signal Preceding Signal #2, and transmit the generated signal to the memory die Die1 630. The memory die Die1 630 may start the program operation in response to the received write command, complete the program operation in response to the received second instruction signal, and transmit a second report signal Return Signal #2 to the memory controller 520. The second report signal Return Signal #2 may indicate the completion of the program operation.

In response to the second report signal Return Signal#2, the memory controller 520 may generate a third instruction signal Preceding Signal #3 and transmit the generated signal to the memory die Die2 650. The memory die Die2 650 may start the program operation in response to the received write command, complete the program operation in response to the received third instruction signal, and transmit a third report signal Return Signal #3 to the memory controller 520. The third report signal Return Signal #3 may indicate the completion of the program operation.

In response to the second report signal Return Signal#3, the memory controller 520 may generate a fourth instruction signal Preceding Signal #4 and transmit the generated signal to the memory die Die3 670. The memory die Die3 670 may start the program operation in response to the received write command, complete the program operation in response to the received fourth instruction signal, and transmit a fourth report signal Return Signal #4 to the memory controller 520. The fourth report signal Return Signal #4 may indicate the completion of the program operation.

In response to the instruction signals, the program operation 1231 for the memory die Die0 610 may be completed, the program operation 1232 for the memory die Die1 630 may be completed, the program operation 1233 for the memory die Die2 650 may be completed, and the program operation 1234 for the memory die Die3 670 may be finally completed. That is, when the programming completion sequence is set in order of the first memory die Die0 610, the second memory die Die1 630, the third memory die Die2 650 and the fourth memory die Die3 670, the program operations for the plurality of memory dies may be sequentially completed.

In accordance with the above-described embodiments, the firmware of the processor 510 may transmit write commands with sequence numbers to the memory controller 520 when sequential programming (or write) is required. The memory controller 520 may transmit an instruction signal (for example, preceding signal) based on the corresponding sequence number to a specific memory die (or NAND Flash) of the memory device 150. In some embodiments, the instruction signal may instruct the memory die to complete a program operation. The memory die receiving the instruction signal may complete the write operation (or program operation). On the other hand, a memory die which did not receive an instruction signal may hold an operation and wait in a busy state. In this state, when an instruction signal is received, the memory die may complete the program operation, and transmit a report signal to the memory controller 520. In some embodiments, the report signal may indicate the completion of the program operation. The memory controller 520 may receive the report signal, and transmit an instruction signal to the next memory die. Since the programming completion sequence can be designated through this process, the state of the super block as illustrated in FIG. 7B can be guaranteed. That is, the memory device and the memory system in accordance with the embodiments can guarantee the continuity of data in the super block using the instruction signals and the write commands containing the sequence numbers even during the program operations for the plurality of memory blocks, thereby guaranteeing the valid data state. Furthermore, the memory device and the memory system in accordance with the embodiments can guarantee a queuing operation, thereby guaranteeing the performance of the write operation. Furthermore, the memory device and the memory system in accordance with the embodiments can guarantee the necessary processing sequence through the support of the controller.

Hereinafter, a data processing system and electronic equipment provided with the memory system 110 including the memory device 150 and the controller 130 described with reference to FIGS. 1 to 12B in accordance with an embodiment will be described in more detail with reference to FIGS. 13 to 21.

FIGS. 13 to 21 are diagrams schematically illustrating application examples of the data processing system of FIG. 1.

Figure 13:
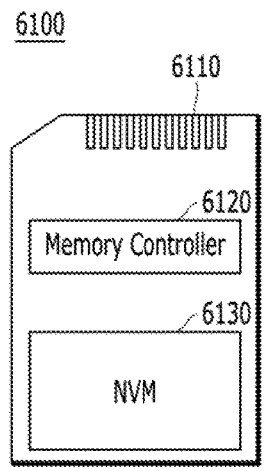
FIGS. 13 to 21 are diagrams schematically illustrating application examples of the data processing system of FIG. 1 in accordance with various embodiments of the present invention.

FIG. 13 is a diagram schematically illustrating another example of the data processing system including the memory system in accordance with an embodiment of the present invention. FIG. 13 schematically illustrates a memory card system to which the memory system in accordance with an embodiment is applied.

Referring to FIG. 13, the memory card system 6100 may include a memory controller 6120, a memory device 6130 and a connector 6110.

More specifically, the memory controller 6120 may be connected to the memory device 6130 embodied by a nonvolatile memory, and configured to access the memory device 6130. For example, the memory controller 6120 may be configured to control read, write, erase and background operations of the memory device 6130. The memory controller 6120 may be configured to provide an interface between the memory device 6130 and a host, and drive firmware for controlling the memory device 6130. That is, the memory controller 6120 may correspond to the controller 130 of the memory system 110 described with reference to FIGS. 1 and 5, and the memory device 6130 may correspond to the memory device 150 of the memory system 110 described with reference to FIGS. 1 and 5.

Thus, the memory controller 6120 may include a random access memory (RAM), a processing unit, a host interface, a memory interface and an error correction unit. The memory controller 130 may further include the elements shown in FIG. 5.

The memory controller 6120 may communicate with an external device, for example, the host 102 of FIG. 1 through the connector 6110. For example, as described with reference to FIG. 1, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), wireless fidelity (WI-FI) and Bluetooth. Thus, the memory system and the data processing system in accordance with an embodiment may be applied to wired/wireless electronic devices or particularly mobile electronic devices.

The memory device 6130 may be implemented by a nonvolatile memory. For example, the memory device 6130 may be implemented by various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM). The memory device 6130 may include a plurality of dies as in the memory device 150 of FIG. 5.

The memory controller 6120 and the memory device 6130 may be integrated into a single semiconductor device. For example, the memory controller 6120 and the memory device 6130 may construct a solid state drive (SSD) by being integrated into a single semiconductor device. Also, the memory controller 6120 and the memory device 6130 may construct a memory card such as a PC card (e.g., Personal Computer Memory Card International Association (PCM-CIA)), a compact flash (CF) card, a smart media card (e.g., SM and SMC), a memory stick, a multimedia card (e.g., MMC, RS-MMC, MMCmicro and eMMC), an SD card (e.g., SD, miniSD, microSD and SDHC) and a universal flash storage (UFS).

Figure 14:
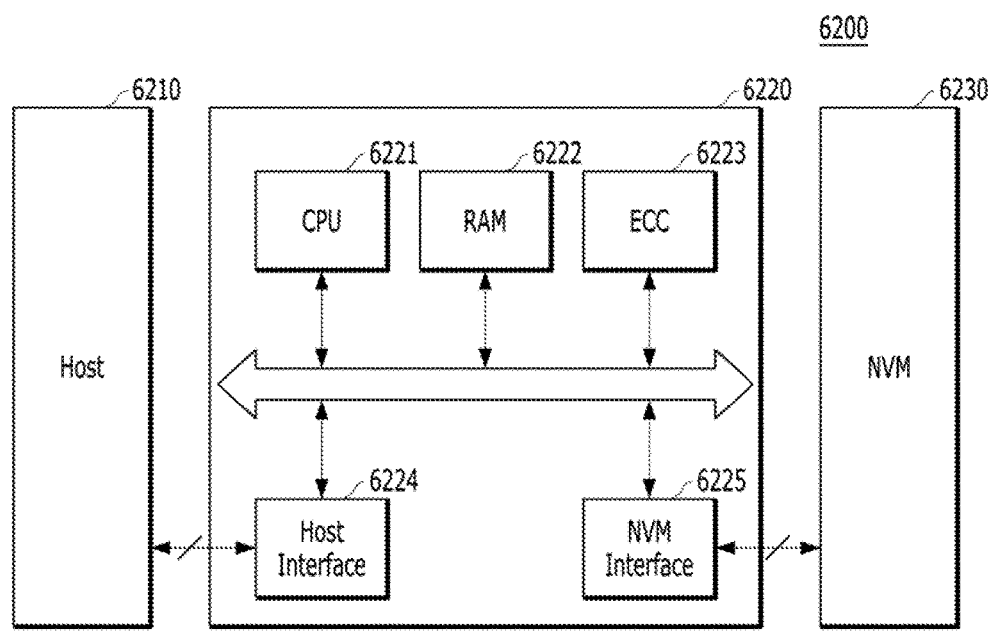

FIG. 14 is a diagram schematically illustrating another example of the data processing system including the memory system in accordance with the present embodiment of the present invention.

Referring to FIG. 14, the data processing system 6200 may include a memory device 6230 having one or more nonvolatile memories (NVMs) and a memory controller 6220 for controlling the memory device 6230. The data processing system 6200 illustrated in FIG. 14 may serve as a storage medium such as a memory card (e.g., CF, SD, micro-SD or the like) or USB device, as described with reference to FIG. 1. The memory device 6230 may correspond to the memory device 150 in the memory system 110 illustrated in FIGS. 1 and 5, and the memory controller 6220 may correspond to the controller 130 in the memory system 110 illustrated in FIGS. 1 and 5.

The memory controller 6220 may control a read, write or erase operation on the memory device 6230 in response to a request of the host 6210, and the memory controller 6220 may include a central processing unit (CPU) 6221, a random access memory (RAM) as a buffer memory 6222, an error correction code (ECC) circuit 6223, a host interface 6224 and an NVM interface as a memory interface 6225.

The CPU 6221 may control overall operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device 6230. When the RAM 6222 is used as a cache memory, the RAM 6222 may assist the low-speed memory device 6230 to operate at high speed.

The ECC circuit 6223 may correspond to the ECC unit 138 of the controller 130 illustrated in FIG. 1. As described with reference to FIG. 1, the ECC circuit 6223 may generate an error correction code for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. At this time, the ECC circuit 6223 may correct an error using the parity bit. For example, as described with reference to FIG. 1, the ECC circuit 6223 may correct an error using any suitable method including a coded modulation such as a low density parity check (LDPC) code, a Bose-Chaudhuri-Hocquenghem (BCH) code, a turbo code, Reed-Solomon (RS) code, a convolution code, a recursive systematic code (RSC), a trellis-coded modulation (TCM) or a Block coded modulation (BCM).

The memory controller 6220 may transmit/receive data to/from the host 6210 through the host interface 6224, and transmit/receive data to/from the memory device 6230 through the NVM interface 6225. The host interface 6224 may be connected to the host 6210 through at least one of various interface protocols such as a parallel advanced technology attachment (PATA) bus, a serial advanced technology attachment (SATA) bus, a small computer system interface (SCSI), a universal serial bus (USB), a peripheral component interconnection express (PCIe) or a NAND interface. The memory controller 6220 may have a wireless communication function with a mobile communication protocol such as wireless fidelity (WI-FI) or long term evolution (LTE). The memory controller 6220 may be connected to an external device, for example, the host 6210 or another external device, and then transmit/receive data to/from the external device. In particular, as the memory controller 6220 is configured to communicate with the external device through one or more of various communication protocols, the memory system and the data processing system in accordance with an embodiment may be applied to wired/wireless electronic devices or particularly a mobile electronic device.

Figure 15:
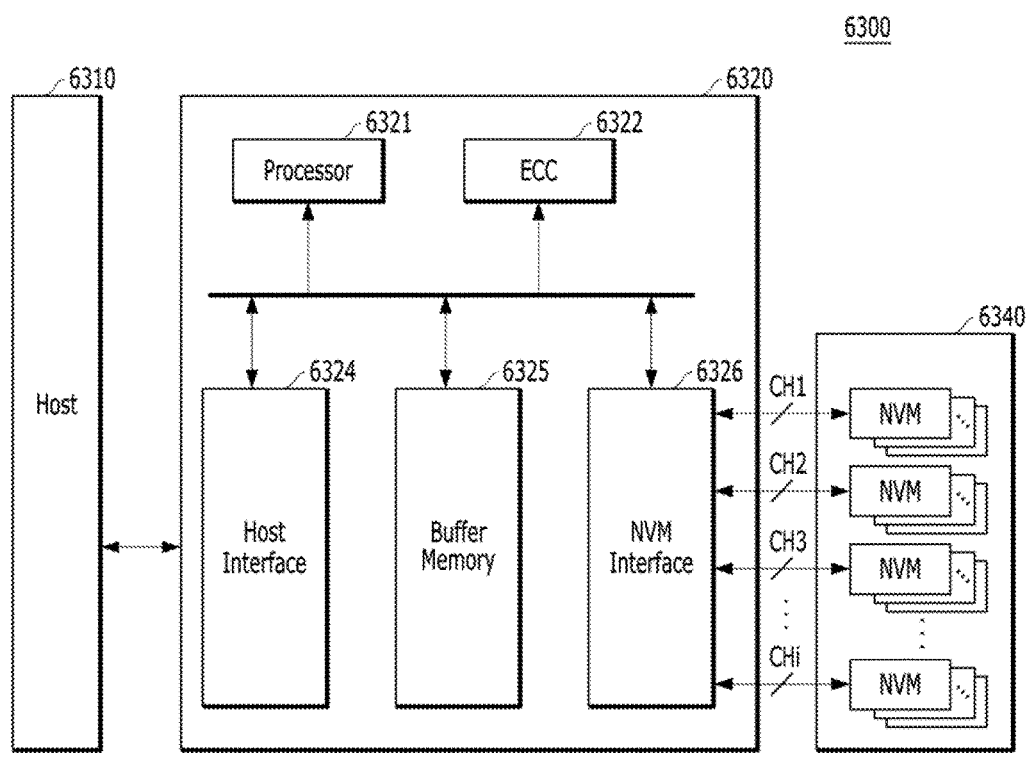

FIG. 15 is a diagram schematically illustrating another example of the data processing system including the memory system in accordance with an embodiment of the present invention. FIG. 15 schematically illustrates a solid state drive (SSD) 6300 to which the memory system in accordance with an embodiment is applied.

Referring to FIG. 15, the SSD 6300 may include a controller 6320 and a memory device 6340 including a plurality of nonvolatile memories. The controller 6320 may correspond to the controller 130 in the memory system 110 of FIGS. 1 and 5, and the memory device 6340 may correspond to the memory device 150 in the memory system of FIGS. 1 and 5.

More specifically, the controller 6320 may be connected to the memory device 6340 through a plurality of channels CH1 to CHi. The controller 6320 may include a processor 6321, a buffer memory 6325, an error correction code (ECC) circuit 6322, a host interface 6324 and a nonvolatile memory interface as a memory interface 6326.

The buffer memory 6325 may temporarily store data provided from the host 6310 or data provided from a plurality of flash memories NVM included in the memory device 6340, or temporarily store meta data of the plurality of flash memories NVM, for example, map data including a mapping table. The buffer memory 6325 may be embodied by volatile memories such as a dynamic random access memory (DRAM), a synchronous dynamic random access memory (SDRAM), a double data rate (DDR) SDRAM, a low power double data rate (LPDDR) SDRAM and graphic random access memory (GRAM) or nonvolatile memories such as a ferroelectric random access memory (FRAM), a resistive random access memory (ReRAM), a spin-transfer torque magnetic random access memory (STT-MRAM) and a phase change random access memory (PRAM). For convenience of description, FIG. 10 illustrates that the buffer memory 6325 exists in the controller 6320. However, the buffer memory 6325 may exist outside the controller 6320.

The ECC circuit 6322 may calculate an ECC value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIGS. 1 and 5 is applied may be provided to embody a data processing system, for example, a redundant array of independent disks (RAID) system. At this time, the RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300, and output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 16:
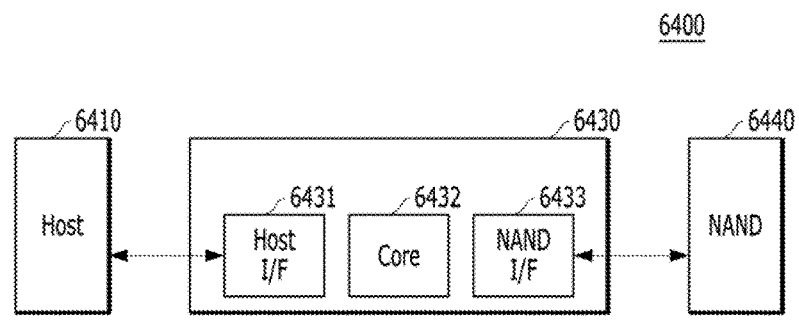

FIG. 16 is a diagram schematically illustrating another example of the data processing system including the memory system in accordance with an embodiment of the present invention. FIG. 16 schematically illustrates an embedded Multi-Media Card (eMMC) to which the memory system in accordance with an embodiment is applied.

Referring to FIG. 16, the eMMC 6400 may include a controller 6430 and a memory device 6440 embodied by one or more NAND flash memories. The controller 6430 may correspond to the controller 130 in the memory system 110 of FIGS. 1 and 5, and the memory device 6440 may correspond to the memory device 150 in the memory system 110 of FIGS. 1 and 5.

More specifically, the controller 6430 may be connected to the memory device 6440 through a plurality of channels. The controller 6430 may include one or more cores 6432, a host interface 6431 and a memory interface, for example, a NAND interface 6433.

The core 6432 may control overall operations of the eMMC 6400, the host interface 6431 may provide an interface function between the controller 6430 and the host 6410, and the NAND interface 6433 may provide an interface function between the memory device 6440 and the controller 6430. For example, the host interface 6431 may serve as a parallel interface such as an MMC interface as described with reference to FIG. 1. Furthermore, the host interface 6431 may serve as a serial interface such as an ultra-high speed class 1 (UHS-I)/UHS class 2 (UHS-II) and a universal flash storage (UFS) interface.

FIGS. 17 to 20 are diagrams schematically illustrating other examples of the data processing system including the memory system in accordance with the present embodiment of the present invention. FIGS. 17 to 20 schematically illustrate universal flash storage (UFS) systems to which the memory system in accordance with an embodiment is applied.

Referring to FIGS. 17 to 20, the UFS systems 6500, 6600, 6700 and 6800 may include hosts 6510, 6610, 6710 and 6810, UFS devices 6520, 6620, 6720 and 6820 and UFS cards 6530, 6630, 6730 and 6830, respectively. The hosts 6510, 6610, 6710 and 6810 may serve as application processors of wired/wireless electronic devices or particularly mobile electronic devices, the UFS devices 6520, 6620, 6720 and 6820 may serve as embedded UFS devices, and the UFS cards 6530, 6630, 6730 and 6830 may serve as external embedded UFS devices or removable UFS cards.

The hosts 6510, 6610, 6710 and 6810, the UFS devices 6520, 6620, 6720 and 6820 and the UFS cards 6530, 6630, 6730 and 6830 in the respective UFS systems 6500, 6600, 6700 and 6800 may communicate with external devices, for example, wired and/or wireless electronic devices or particularly mobile electronic devices through UFS protocols, and the UFS devices 6520, 6620, 6720 and 6820 and the UFS cards 6530, 6630, 6730 and 6830 may be embodied by the memory system 110 illustrated in FIGS. 1 and 5. For example, in the UFS systems 6500, 6600, 6700 and 6800, the UFS devices 6520, 6620, 6720 and 6820 may be embodied in the form of the data processing system 6200, the SSD 6300 or the eMMC 6400 described with reference to FIGS. 14 to 16, and the UFS cards 6530, 6630, 6730 and 6830 may be embodied in the form of the memory card system 6100 described with reference to FIG. 13.

Furthermore, in the UFS systems 6500, 6600, 6700 and 6800, the hosts 6510, 6610, 6710 and 6810, the UFS devices 6520, 6620, 6720 and 6820 and the UFS cards 6530, 6630, 6730 and 6830 may communicate with each other through an UFS interface, for example, MIPI M-PHY and MIPI Unified Protocol (UniPro) in Mobile Industry Processor Interface (MIPI). Furthermore, the UFS devices 6520, 6620, 6720 and 6820 and the UFS cards 6530, 6630, 6730 and 6830 may communicate with each other through various protocols other than the UFS protocol, for example, USB flash drives (UFDs), multimedia card (MMC), secure digital (SD), mini-SD, and micro-SD.

Figure 17:
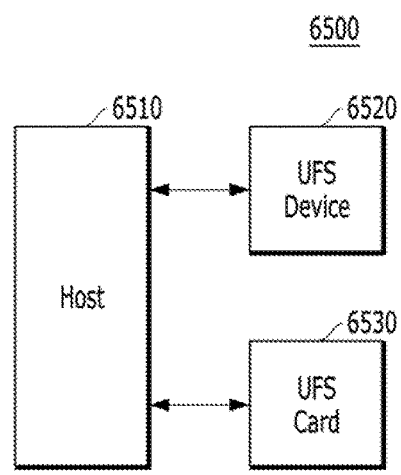

In the UFS system 6500 illustrated in FIG. 17, each of the host 6510, the UFS device 6520 and the UFS card 6530 may include UniPro. The host 6510 may perform a switching operation in order to communicate with the UFS device 6520 and the UFS card 6530. In particular, the host 6510 may communicate with the UFS device 6520 or the UFS card 6530 through link layer switching, for example, L3 switching at the UniPro. At this time, the UFS device 6520 and the UFS card 6530 may communicate with each other through link layer switching at the UniPro of the host 6510. In an embodiment, the configuration in which one UFS device 6520 and one UFS card 6530 are connected to the host 6510 has been exemplified for convenience of description. However, a plurality of UFS devices and UFS cards may be connected in parallel or in the form of a star to the host 6410, and a plurality of UFS cards may be connected in parallel or in the form of a star to the UFS device 6520 or connected in series or in the form of a chain to the UFS device 6520.

Figure 18:
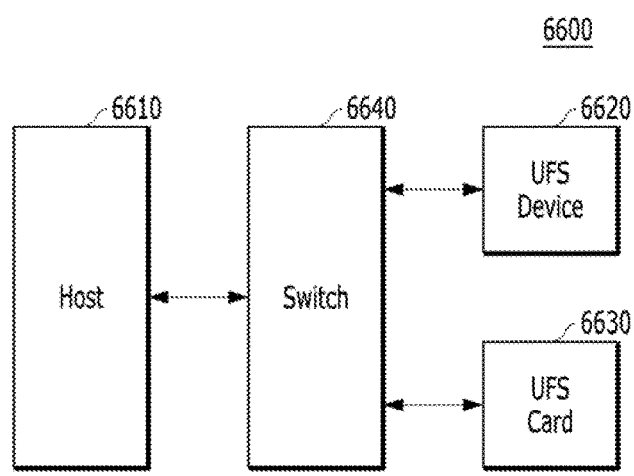

In the UFS system 6600 illustrated in FIG. 18, each of the host 6610, the UFS device 6620 and the UFS card 6630 may include UniPro, and the host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In an embodiment, the configuration in which one UFS device 6620 and one UFS card 6630 are connected to the switching module 6640 has been exemplified for convenience of description. However, a plurality of UFS devices and UFS cards may be connected in parallel or in the form of a star to the switching module 6640, and a plurality of UFS cards may be connected in series or in the form of a chain to the UFS device 6620.

Figure 19:
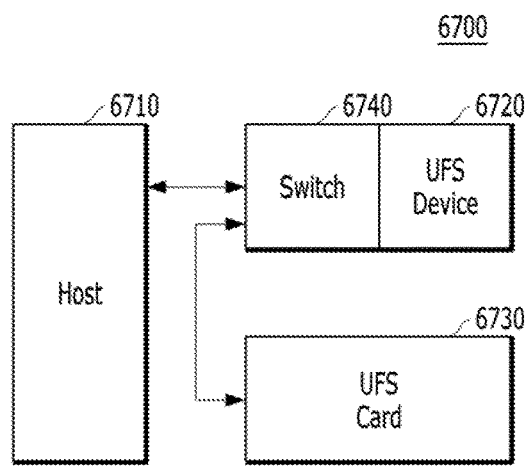

In the UFS system 6700 illustrated in FIG. 19, each of the host 6710, the UFS device 6720 and the UFS card 6730 may include UniPro, and the host 6710 may communicate with the UFS device 6720 or the UFS card 6730 through a switching module 6740 performing a switching operation, for example, through the switching module 6740 which performs link layer switching at the UniPro, for example, L3 switching. At this time, the UFS device 6720 and the UFS card 6730 may communicate with each other through link layer switching of the switching module 6740 at the UniPro, and the switching module 6740 may be integrated as one module with the UFS device 6720 inside or outside the UFS device 6720. In an embodiment, the configuration in which one UFS device 6720 and one UFS card 6730 are connected to the switching module 6740 has been exemplified for convenience of description. However, a plurality of modules each including the switching module 6740 and the UFS device 6720 may be connected in parallel or in the form of a star to the host 6710 or connected in series or in the form of a chain to each other. Furthermore, a plurality of UFS cards may be connected in parallel or in the form of a star to the UFS device 6720.

Figure 20:
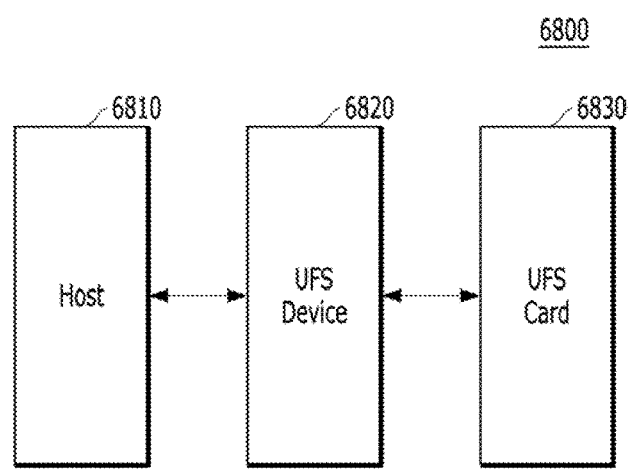

In the UFS system 6800 illustrated in FIG. 20, each of the host 6810, the UFS device 6820 and the UFS card 6830 may include M-PHY and UniPro. The UFS device 6820 may perform a switching operation in order to communicate with the host 6810 and the UFS card 6830. In particular, the UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target identifier (ID) switching operation. At this time, the host 6810 and the UFS card 6830 may communicate with each other through target ID switching between the M-PHY and UniPro modules of the UFS device 6820. In an embodiment, the configuration in which one UFS device 6820 is connected to the host 6810 and one UFS card 6830 is connected to the UFS device 6820 has been exemplified for convenience of description. However, a plurality of UFS devices may be connected in parallel or in the form of a star to the host 6810, or connected in series or in the form of a chain to the host 6810, and a plurality of UFS cards may be connected in parallel or in the form of a star to the UFS device 6820, or connected in series or in the form of a chain to the UFS device 6820.

Figure 21:
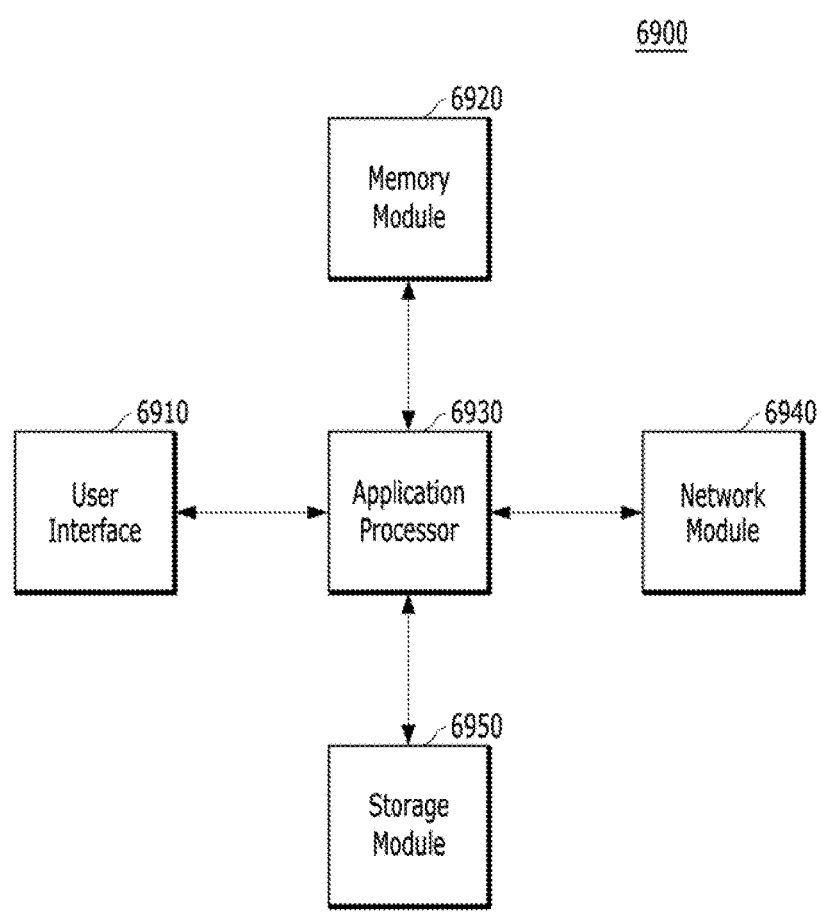

FIG. 21 is a diagram schematically illustrating another example of the data processing system including the memory system in accordance with an embodiment of the present invention. FIG. 21 is a diagram schematically illustrating a user system to which the memory system in accordance with an embodiment is applied.

Referring to FIG. 21, the user system 6900 may include an application processor 6930, a memory module 6920, a network module 6940, a storage module 6950 and a user interface 6910.

More specifically, the application processor 6930 may drive components included in the user system 6900, for example, an OS, and include controllers, interfaces and a graphic engine which control the components included in the user system 6900. The application processor 6930 may be provided as System-on-Chip (SoC).

The memory module 6920 may be used as a main memory, work memory, buffer memory or cache memory of the user system 6900. The memory module 6920 may include a volatile RAM such as a dynamic random access memory (DRAM), a synchronous dynamic random access memory (SDRAM), a double data rate (DDR) SDRAM, a DDR2 SDRAM, a DDR3 SDRAM, a low power double data rate (LPDDR) SDARM, an LPDDR2 SDRAM and an LPDDR3 SDRAM or a nonvolatile RAM such as a phase change random access memory (PRAM), a resistive random access memory (ReRAM), a magnetic random access memory (MRAM) and a ferroelectric random access memory (FRAM). For example, the application processor 6930 and the memory module 6920 may be packaged and mounted, based on a package-on-package (POP).

The network module 6940 may communicate with external devices. For example, the network module 6940 may not only support wired communication, but also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (WiMAX), wireless local area network (WLAN), ultra-wideband (UWB), Bluetooth, wireless display (WI-DI), thereby communicating with wired and/or wireless electronic devices or particularly mobile electronic devices. Therefore, the memory system and the data processing system, in accordance with an embodiment of the present invention, can be applied to wired and/or wireless electronic devices. The network module 6940 may be included in the application processor 6930.

The storage module 6950 may store data, for example, data provided from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, NOR flash and 3D NAND flash, and provided as a removable storage medium such as a memory card or external drive of the user system 6900. The storage module 6950 may correspond to the memory system 110 described with reference to FIGS. 1 and 5. Furthermore, the storage module 6950 may be embodied as an SSD, eMMC and UFS as described above with reference to FIGS. 15 to 20.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, a light emitting diode (LED), a speaker and a motor.

Furthermore, when the memory system 110 of FIGS. 1 and 5 is applied to a mobile electronic device of the user system 6900, the application processor 6930 may control overall operations of the mobile electronic device, and the network module 6940 may serve as a communication module for controlling wired and/or wireless communication with an external device. The user interface 6910 may display data processed by the processor 6930 on a display/touch module of the mobile electronic device, or support a function of receiving data from the touch panel.

Although various embodiments have been described for illustrative purposes, it will be apparent to those skilled in the art that various other embodiments, changes and modifications thereof may be made without departing from the spirit and scope of the invention as defined in the following claims.

What is claimed is:

1. A memory system comprising:
   a memory device comprising a plurality of memory dies; and
   a controller suitable for generating instruction information instructing sequential completion of program operations for the plurality of memory dies in response to a write command and transmitting the write command and the instruction information to the memory device,
   wherein the instruction information comprises instruction signals instructing the plurality of memory dies to sequentially complete program operations for memory blocks constituting a super block in the plurality of memory dies, and
   wherein each of the memory dies starts the program operation in response to the received write command, performs the program operation up to a preset step, transitions to a program suspended state, resumes the suspended program operation in response to the corresponding instruction signal, and transmits a report signal indicating the completion of the program operation to the controller.

2. The memory system of claim 1, wherein the controller comprises:
   a processor suitable for generating sequence numbers indicating a sequence of the program operations for the memory blocks; and
   a memory controller suitable for generating the instruction signals indicating the sequential completion of the program operations for the memory blocks, based on the sequence numbers, and providing the generated instruction signals to the respective memory dies.

3. The memory system of claim 2, wherein the memory controller transmits a first instruction signal of the instruction signals to a first memory die among the plurality of memory dies, generates a second instruction signal and provides the generated second instruction signal to a second memory die among the plurality of memory dies.

4. The memory system of claim 3, wherein the memory controller generates the second instruction signal in response to a program completion report signal which is received from the first memory die in response to the first instruction signal, and transmits the generated second instruction signal to the second memory die.

5. A memory device comprising:
   first and second memory dies each having a plurality of memory blocks,
   wherein the first and second memory dies perform program operations in response to received write commands, and complete the program operations in response to instruction information instructing sequential completion of program operations for the first and second memory dies,
   wherein the instruction information comprises instruction signals instructing the first and second memory dies to sequentially complete program operations for memory blocks constituting a super block in the first and second memory dies, and
   wherein each of the first and second memory dies starts the program operation in response to the received write command, performs the program operation up to a preset step, transitions to a program suspended state, resumes the suspended program operation in response to the corresponding instruction signal, and transmits a report signal indicating the completion of the program operation to the controller.

6. The memory device of claim 5, wherein the instruction signals are generated based on sequence numbers indicating a sequence of the program operations for the memory blocks.

7. The memory device of claim 6, wherein the first and second memory dies receive first and second instruction signals, respectively, among the instruction signals, and
   the second memory die receives the second instruction signal which the controller transmits in response to a report signal which the first memory die transmits after completing the suspended program operation in response to the first instruction signal.

8. An operating method of a memory system including a memory device having a plurality of memory dies, the operating method comprising:
   generating instruction information in response to a write command, the instruction information instructing sequential completion of program operations for the plurality of memory dies;
   transmitting the write command and the instruction information to the memory device;
   by each of the memory dies, performing the program operation to a preset step, and transitioning to a program suspended state; and
   by each of the memory dies, resuming the suspended program operation in response to the corresponding instruction signal, and transmitting a report signal indicating the completion of the program operation to a controller,
   wherein the instruction information comprises instruction signals instructing the plurality of memory dies to sequentially complete program operations for memory blocks constituting a super block in the plurality of memory dies.

9. The operating method of claim 8, further comprising generating sequence numbers indicating the sequence of the program operations for the memory blocks,
   the generating of the instruction information comprises generating the instruction signals based on the sequence numbers, the instruction signals instructing the plurality of memory dies to sequentially complete the program operations for the memory blocks.

10. The operating method of claim 9, wherein the transmitting of the write command and the instruction information to the memory device comprises:
    transmitting a first instruction signal of the instruction signals to a first memory die among the plurality of memory dies; and
    generating a second instruction signal and transmitting the second instruction signal to a second memory die among the plurality of memory dies.

11. The operating method of claim 10, wherein the generating of the second instruction signal comprises:
    generating the second instruction signal in response to a program completion report signal which is received from the first memory die in response to the first instruction signal; and
    transmitting the second instruction signal to the second memory die.

* * * * *